(12) United States Patent
DeKeuster (10) Patent No.: US 9,620,764 B2
(45) Date of Patent: Apr. 11, 2017

(54) BATTERY MODULE COOLING FINS AND FOOTINGS SYSTEM AND METHOD

(71) Applicant: Johnson Controls Technology Company, Holland, WI (US)

(72) Inventor: Richard M. DeKeuster, Racine, WI (US)

(73) Assignee: Johnson Controls Technology Company, Holland, MI (US)

(*) Notice: Subject to any disclaimer, the term of this patent is extended or adjusted under 35 U.S.C. 154(b) by 98 days.

(21) Appl. No.: 14/634,236

(22) Filed: Feb. 27, 2015

(65) Prior Publication Data

US 2016/0197384 A1    Jul. 7, 2016

Related U.S. Application Data (60) Provisional application No. 62/100,001, filed on Jan. 5, 2015.

(51) Int. Cl.
    *H01M 2/30* (2006.01)
    *H01M 2/10* (2006.01)
    (Continued)

(52) U.S. Cl.
    CPC .......... *H01M 2/305* (2013.01); *G01R 31/362* (2013.01); *G01R 31/3658* (2013.01); *H01M 2/02* (2013.01); *H01M 2/04* (2013.01); *H01M 2/10* (2013.01); *H01M 2/1005* (2013.01); *H01M 2/1016* (2013.01); *H01M 2/1072* (2013.01); *H01M 2/1077* (2013.01); *H01M 2/1083* (2013.01); *H01M 2/12* (2013.01); *H01M 2/1205* (2013.01); *H01M 2/1211* (2013.01); *H01M 2/1217* (2013.01); *H01M 2/1241* (2013.01); *H01M 2/1252* (2013.01); *H01M 2/1294* (2013.01); *H01M 2/18* (2013.01); *H01M 2/20* (2013.01);
    (Continued)

(58) Field of Classification Search
    None
    See application file for complete search history.

(56) References Cited

U.S. PATENT DOCUMENTS

| | | |
|---|---|---|
| 5,448,830 A | 9/1995 | Borchert et al. |
| 6,668,910 B2 | 12/2003 | Gawve |

(Continued)

FOREIGN PATENT DOCUMENTS

JP     2008270297 A    11/2008

OTHER PUBLICATIONS

PCT/US2016/013746 International Search Report dated Apr. 14, 2016.

*Primary Examiner* — Patrick Ryan
*Assistant Examiner* — Wyatt McConnell
(74) *Attorney, Agent, or Firm* — Fletcher Yoder, P.C.

(57) ABSTRACT

The present disclosure includes a battery module having a housing with a wall that includes an aperture in the wall. The battery module also includes an electrochemical cell having a terminal end and a base end opposite the terminal end. The electrochemical cell is disposed within the housing such that the base end is positioned proximate to the aperture of the wall. Further, a heat sink of the battery module is engaged with the aperture and includes cooling fins extending outwardly from the heat sink a first distance from an external surface of the wall. The battery module also includes feet of the housing extending outwardly from the wall a second distance from the external surface of the wall. The second distance is greater than the first distance.

22 Claims, 8 Drawing Sheets (51) Int. Cl.
      *H01M 10/052*     (2010.01)
      *H01M 2/20*       (2006.01)
      *H01M 2/22*       (2006.01)
      *H01M 2/32*       (2006.01)
      *H01M 2/12*       (2006.01)
      *H01M 10/48*      (2006.01)
      *H01M 10/613*     (2014.01)
      *H01M 10/625*     (2014.01)
      *H01M 10/647*     (2014.01)
      *H01M 10/653*     (2014.01)
      *H01M 10/6551*    (2014.01)
      *G01R 31/36*      (2006.01)
      *H01M 10/0525*    (2010.01)
      *H01M 10/42*      (2006.01)
      *H01M 2/24*       (2006.01)
      *H01M 10/6557*    (2014.01)
      *H01M 2/18*       (2006.01)
      *H01M 10/04*      (2006.01)
      *H01M 10/058*     (2010.01)
      *H01M 2/02*       (2006.01)
      *H01M 2/04*       (2006.01)
      *H01M 2/34*       (2006.01)
      *H01M 10/02*      (2006.01)
      *H01M 10/60*      (2014.01)
      *H01M 10/65*      (2014.01)

(52) U.S. Cl.
      CPC ............. *H01M 2/206* (2013.01); *H01M 2/22* (2013.01); *H01M 2/24* (2013.01); *H01M 2/30* (2013.01); *H01M 2/32* (2013.01); *H01M 2/34* (2013.01); *H01M 10/02* (2013.01); *H01M 10/0413* (2013.01); *H01M 10/052* (2013.01); *H01M 10/058* (2013.01); *H01M 10/0525* (2013.01); *H01M 10/4207* (2013.01); *H01M 10/4257* (2013.01); *H01M 10/482* (2013.01); *H01M 10/60* (2015.04); *H01M 10/613* (2015.04); *H01M 10/625* (2015.04); *H01M 10/647* (2015.04); *H01M 10/65* (2015.04); *H01M 10/653* (2015.04); *H01M 10/6551* (2015.04); *H01M 10/6557* (2015.04); *H01M 2010/4271* (2013.01); *H01M 2220/10* (2013.01); *H01M 2220/20* (2013.01)

(56) References Cited

U.S. PATENT DOCUMENTS

| | | |
|---|---|---|
| 6,827,130 B2    | 12/2004 | Larson |
| 7,182,127 B2    | 2/2007  | Oh et al. |
| 7,708,054 B2    | 5/2010  | Watanabe et al. |
| 8,182,936 B2    | 5/2012  | Tamura et al. |
| 8,841,016 B2    | 9/2014  | Anderson et al. |
| 2010/0015512 A1 | 1/2010  | Inoue et al. |
| 2011/0067849 A1 | 3/2011  | Fujino et al. |
| 2013/0128461 A1 | 5/2013  | Nagasawa |
| 2013/0157100 A1 | 6/2013  | Heise et al. |
| 2013/0206376 A1 | 8/2013  | Shikazono et al. |
| 2013/0258645 A1 | 10/2013 | Weber et al. |
| 2014/0154547 A1 | 6/2014  | Anderson et al. |
| 2014/0158326 A1 | 6/2014  | Lyon |
| 2014/0272517 A1 | 9/2014  | Glasgow et al. |
| 2014/0318751 A1 | 10/2014 | Kinder et al. |

BATTERY MODULE COOLING FINS AND FOOTINGS SYSTEM AND METHOD

CROSS-REFERENCE TO RELATED APPLICATION

This application claims priority from and the benefit of U.S. Provisional Application Ser. No. 62/100,001, filed Jan. 5, 2015, entitled "MECHANICAL AND ELECTRICAL ASPECTS OF LITHIUM ION BATTERY MODULE WITH VERTICAL AND HORIZONTAL CONFIGURATIONS," which is hereby incorporated by reference in its entirety for all purposes.

BACKGROUND

The present disclosure relates generally to the field of batteries and battery modules. More specifically, the present disclosure relates to cooling fins and footings of lithium-ion (Li-ion) battery modules.

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

A vehicle that uses one or more battery systems for providing all or a portion of the motive power for the vehicle can be referred to as an xEV, where the term "xEV" is defined herein to include all of the following vehicles, or any variations or combinations thereof, that use electric power for all or a portion of their vehicular motive force. For example, xEVs include electric vehicles (EVs) that utilize electric power for all motive force. As will be appreciated by those skilled in the art, hybrid electric vehicles (HEVs), also considered xEVs, combine an internal combustion engine propulsion system and a battery-powered electric propulsion system, such as 48 Volt (V) or 130V systems. The term HEV may include any variation of a hybrid electric vehicle. For example, full hybrid systems (FHEVs) may provide motive and other electrical power to the vehicle using one or more electric motors, using only an internal combustion engine, or using both. In contrast, mild hybrid systems (MHEVs) disable the internal combustion engine when the vehicle is idling and utilize a battery system to continue powering the air conditioning unit, radio, or other electronics, as well as to restart the engine when propulsion is desired. The mild hybrid system may also apply some level of power assist, during acceleration for example, to supplement the internal combustion engine. Mild hybrids are typically 96V to 130V and recover braking energy through a belt or crank integrated starter generator. Further, a micro-hybrid electric vehicle (mHEV) also uses a "Stop-Start" system similar to the mild hybrids, but the micro-hybrid systems of a mHEV may or may not supply power assist to the internal combustion engine and operates at a voltage below 60V. For the purposes of the present discussion, it should be noted that mHEVs typically do not technically use electric power provided directly to the crankshaft or transmission for any portion of the motive force of the vehicle, but an mHEV may still be considered as an xEV since it does use electric power to supplement a vehicle's power needs when the vehicle is idling with internal combustion engine disabled and recovers braking energy through an integrated starter generator. In addition, a plug-in electric vehicle (PEV) is any vehicle that can be charged from an external source of electricity, such as wall sockets, and the energy stored in the rechargeable battery packs drives or contributes to drive the wheels. PEVs are a subcategory of EVs that include all-electric or battery electric vehicles (BEVs), plug-in hybrid electric vehicles (PHEVs), and electric vehicle conversions of hybrid electric vehicles and conventional internal combustion engine vehicles.

xEVs as described above may provide a number of advantages as compared to more traditional gas-powered vehicles using only internal combustion engines and traditional electrical systems, which are typically 12V systems powered by a lead acid battery. For example, xEVs may produce fewer undesirable emission products and may exhibit greater fuel efficiency as compared to traditional internal combustion vehicles and, in some cases, such xEVs may eliminate the use of gasoline entirely, as is the case of certain types of EVs or PEVs.

As technology continues to evolve, there is a need to provide improved power sources, particularly battery modules, for such vehicles. For example, in traditional configurations, battery modules include thermal management systems that may be bulky, inefficient, fragile, and so forth. Further, the configuration of traditional battery modules may be arranged such that components of the thermal management system are unprotected from damaging contact with external surfaces or components. Accordingly, it is now recognized that there is a need for improved battery modules and corresponding thermal management systems (e.g., passive thermal management systems, active thermal management systems, or both).

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure relates to a battery module having a housing with a wall that includes an aperture in the wall. The battery module also includes an electrochemical cell having a terminal end and a base end opposite the terminal end. The electrochemical cell is disposed within the housing such that the base end is positioned proximate to the aperture of the wall. Further, a heat sink of the battery module is engaged with the aperture and includes cooling fins extending outwardly from the heat sink a first distance from an external surface of the wall. The battery module also includes feet of the housing extending outwardly from the wall a second distance from the external surface of the wall. The second distance is greater than the first distance.

The present disclosure also relates a battery module having a housing with a back wall. An aperture is disposed in the back wall, and feet of the housing extend outwardly from the back wall a first distance from the back wall. The battery module also includes a heat sink disposed in the aperture. The heat sink includes cooling fins extending outwardly from the heat sink a second distance from the back wall. The first distance is greater than the second distance, and the cooling fins run along the heat sink a first direction generally parallel with a second direction the feet run along the back wall of the housing.

The present disclosure also relates to a battery module having a housing that includes a cavity. The battery module includes a plurality of electrochemical cells disposed in the cavity of the housing and at least one heat sink disposed in a corresponding at least one aperture of a back wall of the housing such that base ends of the plurality of electrochemical cells are disposed proximate to the at least one heat sink. The at least one heat sink includes cooling fins extending outwardly and away from the cavity of the housing a first distance from the housing. The housing includes feet extending outwardly from the housing a second distance from the housing greater than the first distance. The feet define channels that are aligned with the cooling fins of the heat sink.

DRAWINGS

Various aspects of this disclosure may be better understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The battery systems described herein may be used to provide power to various types of electric vehicles (xEVs) and other high voltage energy storage/expending applications (e.g., electrical grid power storage systems). Such battery systems may include one or more battery modules, each battery module having a number of battery cells (e.g., lithium-ion (Li-ion) electrochemical cells) arranged and electrically interconnected to provide particular voltages and/or currents useful to power, for example, one or more components of an xEV. As another example, battery modules in accordance with present embodiments may be incorporated with or provide power to stationary power systems (e.g., non-automotive systems).

In accordance with embodiments of the present disclosure, the battery module may include a housing in which electrochemical cells of the battery module are positioned. For example, the housing may include an opening through which the electrochemical cells are disposed, and a cover of the battery module may be disposed over the opening to seal the housing. After being received by the housing, the electrochemical cells may abut or be disposed proximate to one or more walls of the housing. For example, bases of the electrochemical cells may be disposed proximate to an internal surface of a wall (e.g., back wall) of the housing. The wall may include integral thermal management features or be configured to retain thermal management features in cutouts or apertures thereof. In some embodiments, the cutouts or apertures extend through the wall and are configured to receive thermal pads, heat sinks, cooling fins, thermal paste, or a combination thereof. The thermal management features, for example, may contact the bases of the electrochemical cells (or other sides or surfaces of the electrochemical cells) and extract heat from the electrochemical cells through the bases. As described above, the thermal management features may extend through the cutouts or apertures in the wall, such that the thermal management features engage one or more electrochemical cells (e.g., via a thermal pad) within the housing and are exposed to an environment external to the housing. For example, the thermal management features may extend from adjacent the bases of the electrochemical cells proximate to the internal surface of the wall, through the apertures or cutouts, and to the environment external to the housing (e.g., proximate to an external surface of the wall opposite to the internal surface of the wall). In some embodiments, cooling fins of the thermal management feature(s) (e.g., of the heat sink) may extend outwardly from the heat sink and, thus, away from the external surface of the wall.

In addition to the thermal management features described above, embodiments in accordance with the present disclosure may include feet or extensions on (e.g., integral with) the external surface of the wall. For example, the feet may extend outwardly from the external surface of the wall in a direction generally parallel with the cooling fins extending from the thermal management feature(s) (e.g., from the heat sink). The feet and the cooling fins also extend along a length of the battery module. In accordance with present embodiments, the feet may be offset with respect to the cooling fins in a transverse direction (e.g., perpendicular to the length of the battery module). Accordingly, adjacent feet may form a channel that routes a fluid flow (e.g., air flow) through the channel, along the length of the battery module, and directly into one of the offset cooling fins, thereby enhancing heat transfer from the cooling fins to the fluid flow. Further, the feet may extend farther from the external surface than the cooling fins. Accordingly, the battery module may be positioned upright on a surface of the vehicle, such that the feet contact the surface of the vehicle instead of the cooling fins. In other words, the feet may protect the cooling fins from contacting components of, for example, the vehicle in which the battery module is disposed.

Figure 1:
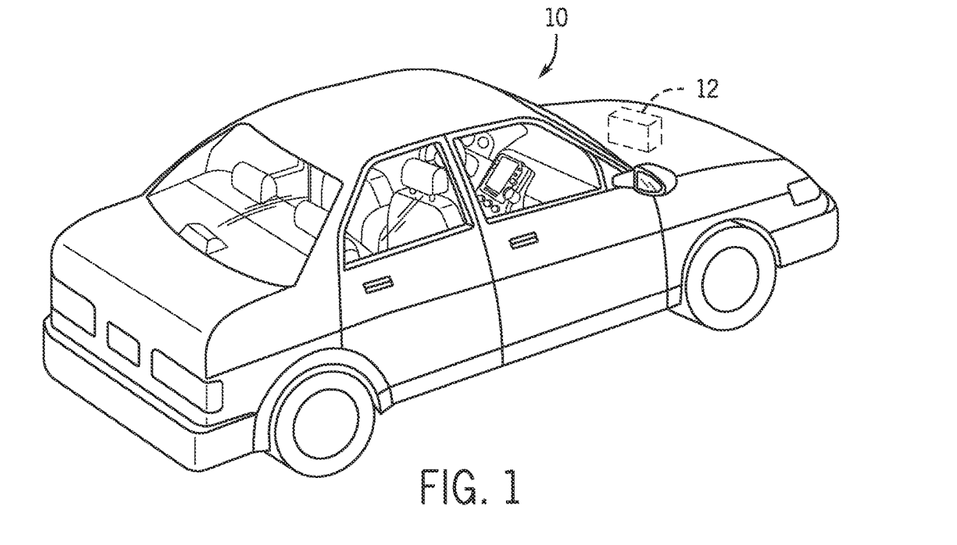
FIG. 1 is a perspective view of a vehicle having a battery system configured in accordance with present embodiments to provide power for various components of the vehicle.

To help illustrate, FIG. 1 is a perspective view of an embodiment of a vehicle 10, which may utilize a regenerative braking system. Although the following discussion is presented in relation to vehicles with regenerative braking systems, the techniques described herein are adaptable to other vehicles that capture/store electrical energy with a battery, which may include electric-powered and gas-powered vehicles.

As discussed above, it would be desirable for a battery system 12 to be largely compatible with traditional vehicle designs. Accordingly, the battery system 12 may be placed in a location in the vehicle 10 that would have housed a traditional battery system. For example, as illustrated, the vehicle 10 may include the battery system 12 positioned similarly to a lead-acid battery of a typical combustion-engine vehicle (e.g., under the hood of the vehicle 10). Furthermore, as will be described in more detail below, the battery system 12 may be positioned to facilitate managing temperature of the battery system 12. For example, in some embodiments, positioning a battery system 12 under the hood of the vehicle 10 may enable an air duct to channel airflow over the battery system 12 and cool the battery system 12.

Figure 2:
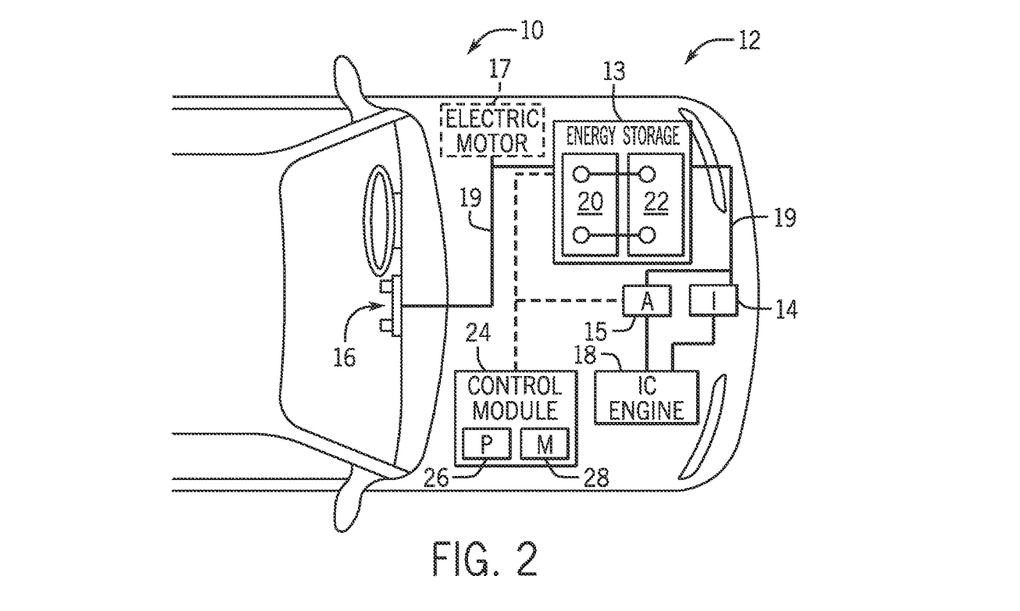
FIG. 2 is a cutaway schematic view of an embodiment of the vehicle and the battery system of FIG. 1.

A more detailed view of the battery system 12 is described in FIG. 2. As depicted, the battery system 12 includes an energy storage component 13 coupled to an ignition system 14, an alternator 15, a vehicle console 16, and optionally to an electric motor 17. Generally, the energy storage component 13 may capture/store electrical energy generated in the vehicle 10 and output electrical energy to power electrical devices in the vehicle 10.

In other words, the battery system 12 may supply power to components of the vehicle's electrical system, which may include radiator cooling fans, climate control systems, electric power steering systems, active suspension systems, auto park systems, electric oil pumps, electric super/turbochargers, electric water pumps, heated windscreen/defrosters, window lift motors, vanity lights, tire pressure monitoring systems, sunroof motor controls, power seats, alarm systems, infotainment systems, navigation features, lane departure warning systems, electric parking brakes, external lights, or any combination thereof. Illustratively, in the depicted embodiment, the energy storage component 13 supplies power to the vehicle console 16 and the ignition system 14, which may be used to start (e.g., crank) the internal combustion engine 18.

Additionally, the energy storage component 13 may capture electrical energy generated by the alternator 15 and/or the electric motor 17. In some embodiments, the alternator 15 may generate electrical energy while the internal combustion engine 18 is running. More specifically, the alternator 15 may convert the mechanical energy produced by the rotation of the internal combustion engine 18 into electrical energy. Additionally or alternatively, when the vehicle 10 includes an electric motor 17, the electric motor 17 may generate electrical energy by converting mechanical energy produced by the movement of the vehicle 10 (e.g., rotation of the wheels) into electrical energy. Thus, in some embodiments, the energy storage component 13 may capture electrical energy generated by the alternator 15 and/or the electric motor 17 during regenerative braking. As such, the alternator 15 and/or the electric motor 17 are generally referred to herein as a regenerative braking system.

To facilitate capturing and supplying electric energy, the energy storage component 13 may be electrically coupled to the vehicle's electric system via a bus 19. For example, the bus 19 may enable the energy storage component 13 to receive electrical energy generated by the alternator 15 and/or the electric motor 17. Additionally, the bus 19 may enable the energy storage component 13 to output electrical energy to the ignition system 14 and/or the vehicle console 16. Accordingly, when a 12 volt battery system 12 is used, the bus 19 may carry electrical power typically between 8-18 volts.

Additionally, as depicted, the energy storage component 13 may include multiple battery modules. For example, in the depicted embodiment, the energy storage component 13 includes a lithium ion (e.g., a first) battery module 20 and a lead-acid (e.g., a second) battery module 22, which each includes one or more battery cells. In other embodiments, the energy storage component 13 may include any number of battery modules. Additionally, although the lithium ion battery module 20 and lead-acid battery module 22 are depicted adjacent to one another, they may be positioned in different areas around the vehicle. For example, the lead-acid battery module 22 may be positioned in or about the interior of the vehicle 10 while the lithium ion battery module 20 may be positioned under the hood of the vehicle 10.

In some embodiments, the energy storage component 13 may include multiple battery modules to utilize multiple different battery chemistries. For example, when the lithium ion battery module 20 is used, performance of the battery system 12 may be improved since the lithium ion battery chemistry generally has a higher coulombic efficiency and/or a higher power charge acceptance rate (e.g., higher maximum charge current or charge voltage) than the lead-acid battery chemistry. As such, the capture, storage, and/or distribution efficiency of the battery system 12 may be improved.

To facilitate controlling the capturing and storing of electrical energy, the battery system 12 may additionally include a control module 24. More specifically, the control module 24 may control operations of components in the battery system 12, such as relays (e.g., switches) within energy storage component 13, the alternator 15, and/or the electric motor 17. For example, the control module 24 may regulate amount of electrical energy captured/supplied by each battery module 20 or 22 (e.g., to de-rate and re-rate the battery system 12), perform load balancing between the battery modules 20 and 22, determine a state of charge of each battery module 20 or 22, determine temperature of each battery module 20 or 22, control voltage output by the alternator 15 and/or the electric motor 17, and the like.

Accordingly, the control unit 24 may include one or more processor 26 and one or more memory 28. More specifically, the one or more processor 26 may include one or more application specific integrated circuits (ASICs), one or more field programmable gate arrays (FPGAs), one or more general purpose processors, or any combination thereof. Additionally, the one or more memory 28 may include volatile memory, such as random access memory (RAM), and/or non-volatile memory, such as read-only memory (ROM), optical drives, hard disc drives, or solid-state drives. In some embodiments, the control unit 24 may include portions of a vehicle control unit (VCU) and/or a separate battery control module.

Figure 3:
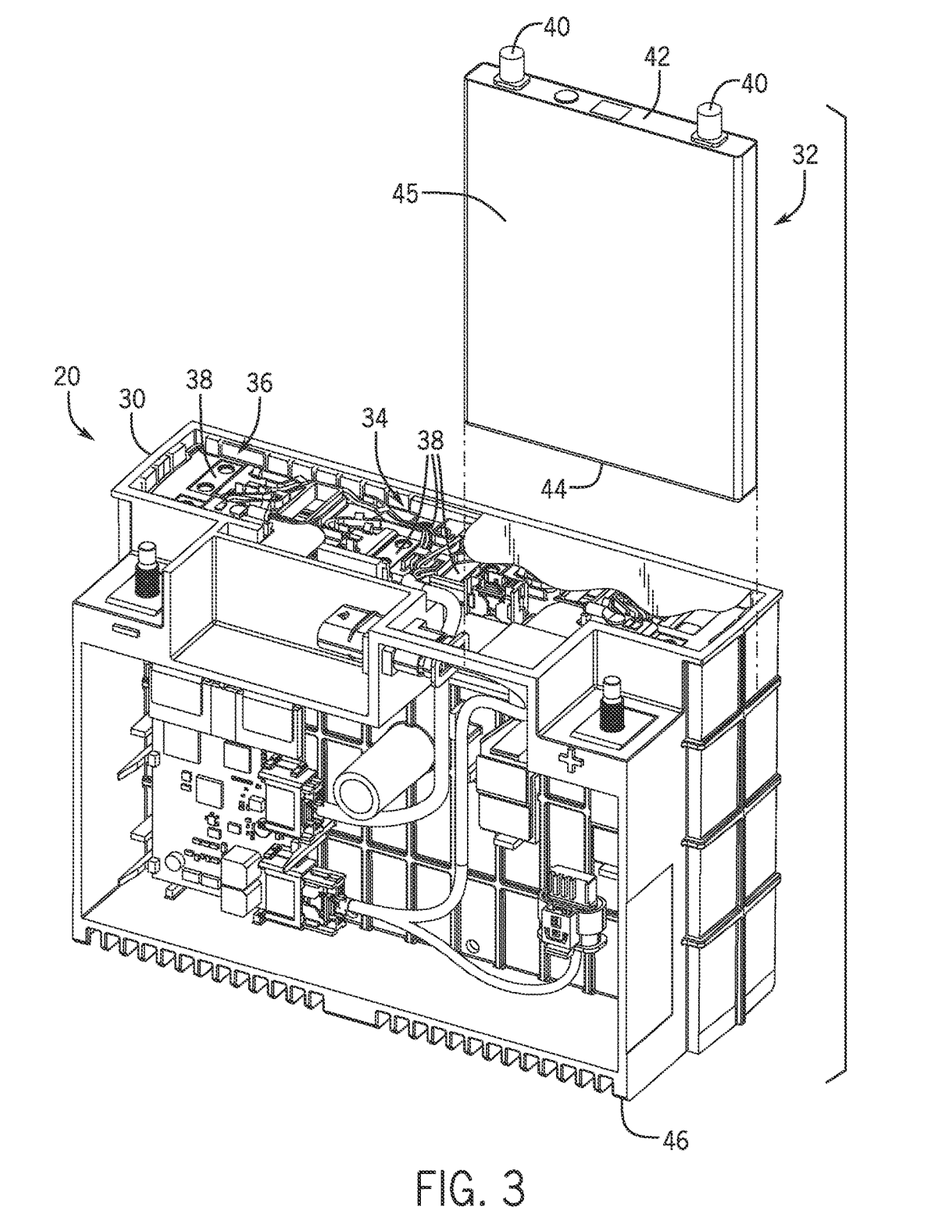
FIG. 3 is a partially exploded, cutaway perspective view of an embodiment of a battery module for use in the vehicle of FIG. 1, in accordance with an aspect of the present disclosure.

An exploded perspective view of an embodiment of the battery module 20 (e.g., lithium-ion (Li-ion) battery module) is shown in FIG. 3. In the illustrated embodiment, the battery module 20 includes a housing 30 (e.g., plastic housing) configured to retain electrochemical cells 32 within the housing 30. For example, the electrochemical cells 32 may be inserted into the housing 30 through an open side 34 of the housing 30. The open side 34 may then be at least partially closed or sealed via a cover 36 (or multiple covers) disposed over the open side 34. One of the covers 36 may include components embedded, attached, or otherwise coupled to the cover 36, where the components interface with the electrochemical cells 32. For example, the cover 36 may include bus bars 38 embedded or otherwise coupled to the cover 36, where the bus bars 38 interface with terminals 40 of the electrochemical cells 32 (or other components, such as adapters disposed over the terminals 40) to electrically couple the terminals 40 and, thus, the electrochemical cells 32 having the terminals 40. The cover 36 may also serve to exert a force on surfaces of the electrochemical cells 32 to push the electrochemical cells 32 into contact with thermal management features on a side of the electrochemical cells 32 opposite to the cover 36.

In general, the electrochemical cells 32 may be prismatic Li-ion cells with a terminal side 42 (e.g., terminal end) having one or more terminals 40 (e.g., two terminals). The electrochemical cells 32 may also include a base end 44 (e.g., base, side, base side, bottom, bottom side, bottom end, end) opposite from the terminal end 42, in addition to opposing broad faces 45 (e.g., faces, sides, broad sides) extending between the terminal end 42 and the base end 44. As shown in the illustrated embodiment, the electrochemical cells 32 may be inserted through the open side 34 of the housing 30 such that the base ends 44 of the electrochemical cells 32 are disposed proximate to (or in contact with) a wall 46 of the housing 30 opposite to the open side 34 of the housing 30. The wall 46 may include thermal management features embedded in the wall 46, or disposed in apertures in the wall 46, that extract heat from the base ends 44 of the electrochemical cells 32. As previously described, the cover 36 may press against the terminal sides 42 of the electrochemical cells 32 so as to force the base ends 44 opposite to the terminal sides 42 toward the thermal management features (e.g., heat sinks and/or thermal pads).

Figure 4:
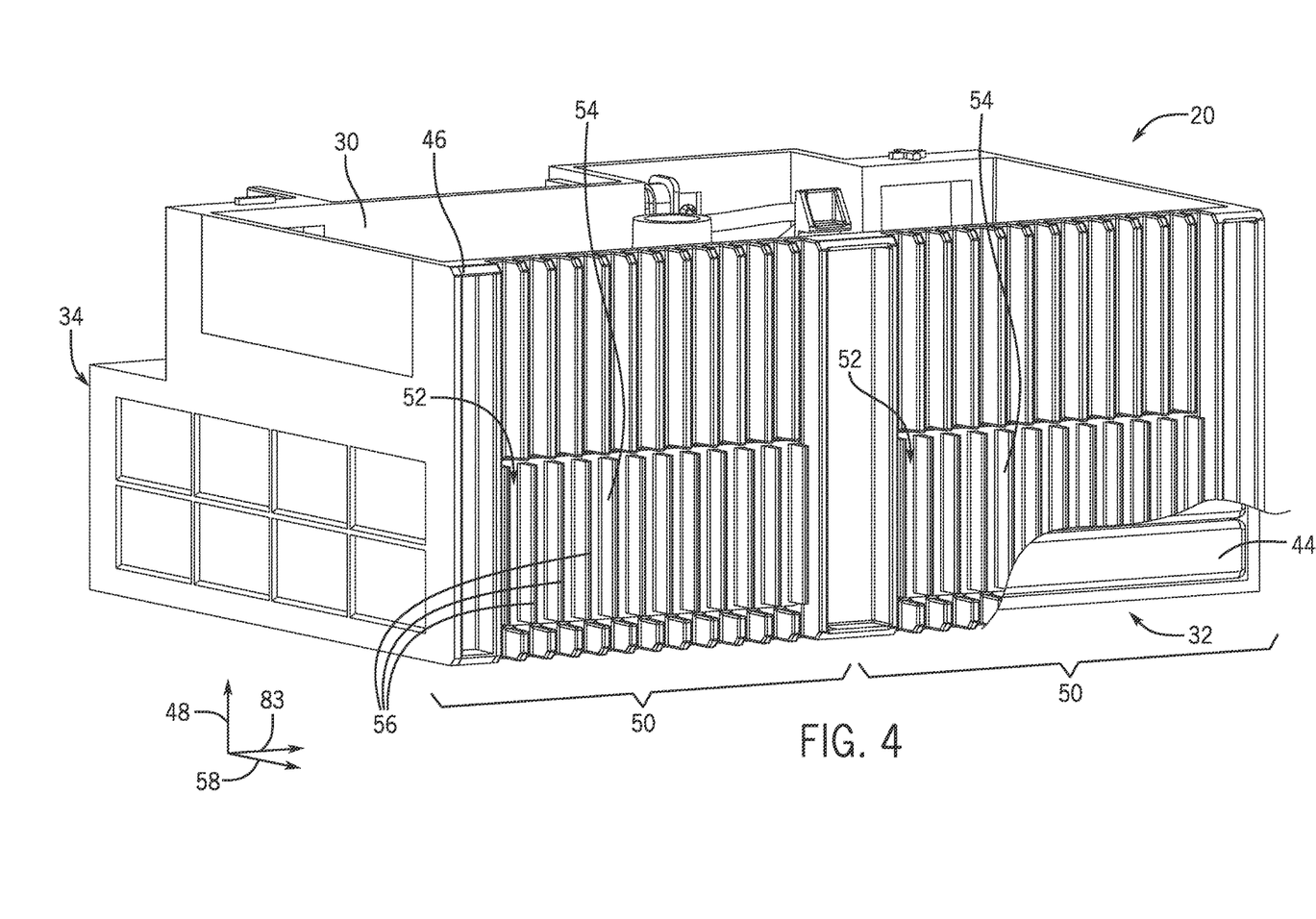
FIG. 4 is a cutaway perspective view of an embodiment of the battery module of FIG. 3, in accordance with an aspect of the present disclosure.
Figure 5:
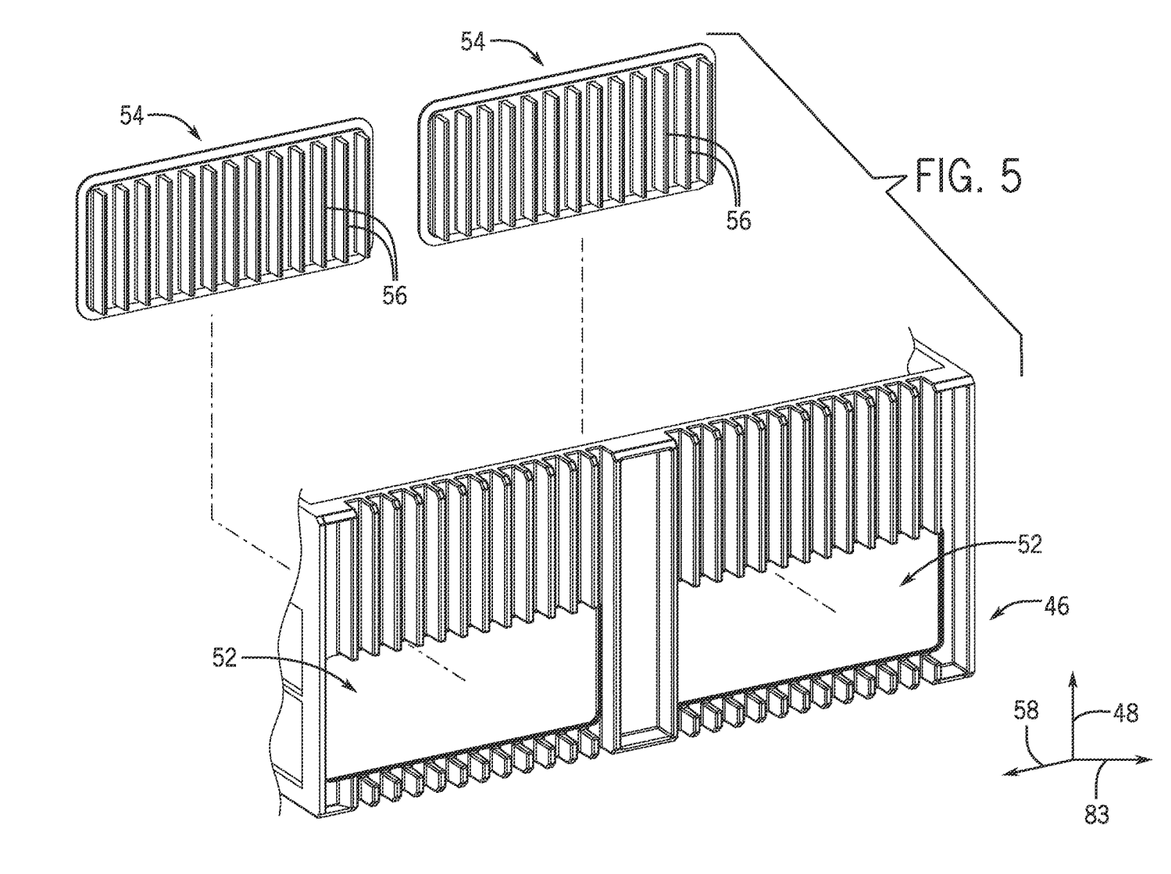
FIG. 5 is an exploded schematic perspective view of an embodiment of a wall of a housing of the battery module of FIG. 3 and heat sinks of the battery module, in accordance with an aspect of the present disclosure.

For clarity, a cutaway perspective view of the battery module 20 of FIG. 3 is shown in FIG. 4. In the illustrated embodiment, the base ends 44 of the electrochemical cells 32 are disposed proximate to (e.g., adjacent) the wall 46 of the housing 30. For example, two stacks of electrochemical cells 32 may be disposed in the housing 30, where each stack includes three electrochemical cells 32 stacked in direction 48 and corresponds with one of the illustrated brackets 50. All of the electrochemical cells 32 may be positioned within the housing 30 such that the base ends 44 of all the electrochemical cells 32 are disposed proximate to (e.g., adjacent) the wall 46. Further, the wall 46 may include apertures 52 that correspond with the stacks 50 of electrochemical cells 32. For example, in the illustrated embodiment, the wall 46 includes two rectangular apertures 52 exposing the base ends 44 of the electrochemical cells 32, where a corresponding heat sink 54 (e.g., metal heat sink or thermally conductive heat sink) is disposed in each rectangular aperture 52 to contact (e.g., cover) the base ends 44 of the electrochemical cells 32. In other words, a shape of each heat sink 54 generally corresponds with a shape of the aperture 52 and a shape of the stack 50 of electrochemical cells 32 proximate the heat sink 54, such that the wall 46 may be sealed by the heat sinks 54 being disposed in the apertures 52 and in contact with, or proximate to, the base ends 44 of the electrochemical cells 32. The heat sinks 54 generally extract heat (directly or indirectly) from the base ends 44 of the electrochemical cells 32, and direct the extracted heat toward cooling fins 56 of the heat sinks, where the cooling fins 56 extend away from the heat sinks 54 and, thus, away from the wall 46 generally in direction 58. Further the cooling fins 56 run (e.g., extend) along the heat sink 54 generally in direction 48. To help illustrate, an exploded schematic perspective view of only the wall 46 of the housing 30 and the heat sinks 54 of the battery module 20 disposed in the apertures 52 of the wall 46 is shown in FIG. 5.

Figure 6:
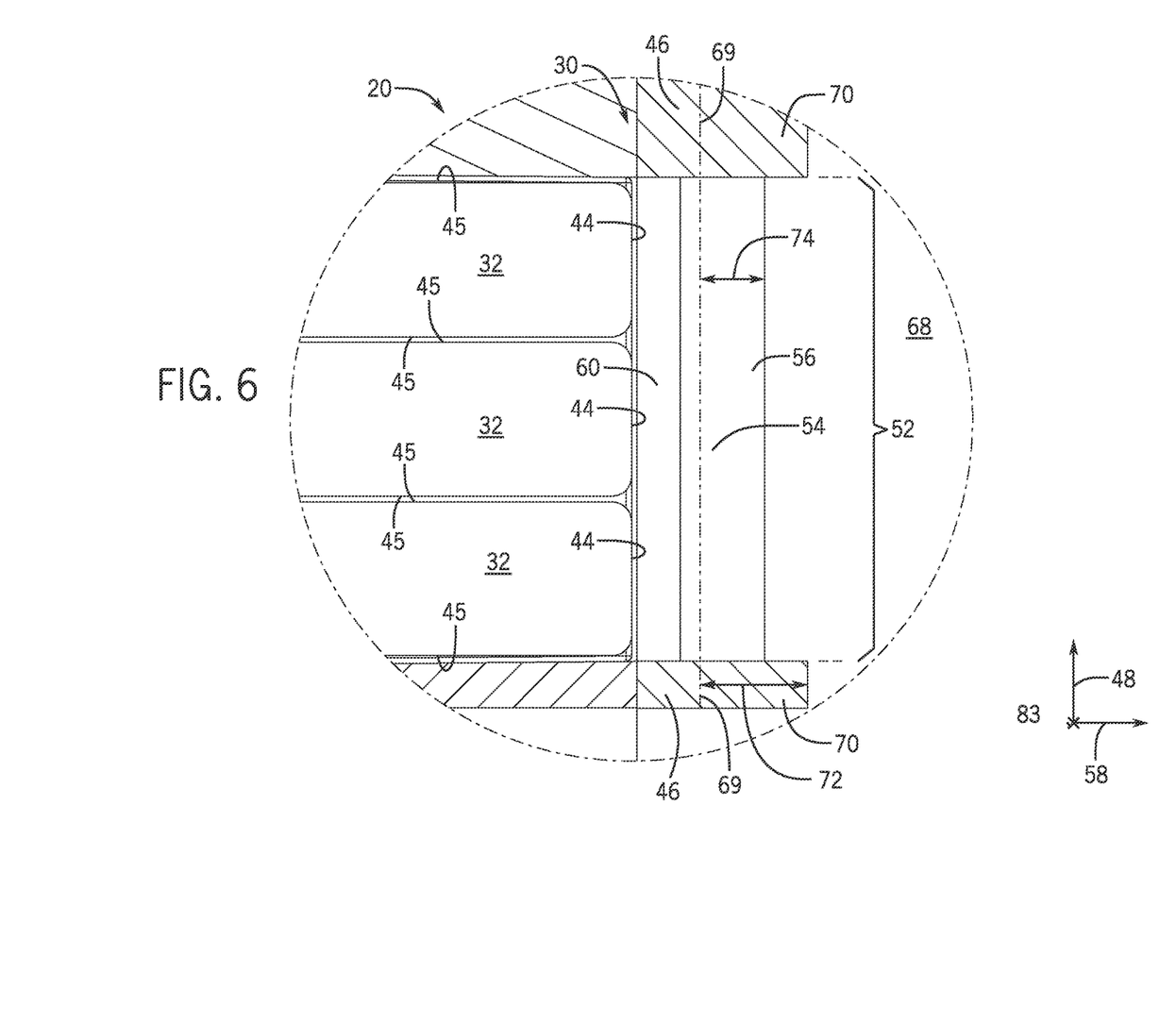
FIG. 6 is a cross-sectional side view of a portion of an embodiment of the battery module of FIG. 3, in accordance with an aspect of the present disclosure.

It should be noted that, in some embodiments, the heat sinks 54 may contact the base ends 44 of the electrochemical cells 32, or one or more intervening components may be disposed between the base ends 44 of the electrochemical cells 32 and the heat sinks 54. For example, a cross-sectional side view of a portion of an embodiment of the battery module 20 of FIG. 3 is shown in FIG. 6. In the illustrated embodiment, the base ends 44 of the electrochemical cells 32 are disposed proximate to the wall 46 of the housing 30 of the battery module 20. More specifically, the base ends 44 of the illustrated electrochemical cells 32 are disposed proximate to one of the apertures 52 in the wall 46 of the housing 30. The heat sink 54 is also disposed proximate to, and aligned with, the aperture 52. However, in the illustrated embodiment, a thermal pad 60 is disposed between the base ends 44 of the electrochemical cells 32 and the heat sink 54. The thermal pad 60 may be a thermal paste, a thermal adhesive, a thermal gap pad, or some other thermal layer with a high relative heat transfer coefficient (e.g., relative to the wall 46 of the housing 20, the heat sink 54, or both). The thermal pad 60 may be compressible, which causes the thermal pad 60, via a force applied to the thermal pad 60 by the base ends 44 of the electrochemical cells 32 and the heat sink 54, to fill space between the base ends 44 and the heat sink 54. In other words, the thermal pad 60 reduces or negates bubbles or pockets of air that would otherwise exist between the more rigid base ends 44 of the electrochemical cells 32 and the more rigid heat sink 54 if the thermal pad 60 were not included and the heat sink 54 directly contacted the base ends 44 of the electrochemical cells 32.

It should be noted that, depending on the embodiment, thermal pads 60 may be disposed in both of the apertures 52 illustrated in FIG. 4, in one of the apertures 52 illustrated in FIG. 4, or in neither of the apertures 52 illustrated in FIG. 4. Further, in embodiments including one or more thermal pads 60 in both the apertures 52, each aperture 52 may include a different number and/or a different type of thermal pad 60 than the other aperture 52. Any suitable arrangement of thermal pads 60 between the base ends 44 of the electrochemical cells 32 and the heat sink 54 may be utilized. Further, it should be noted that, as shown in the embodiment in FIG. 6, each thermal pad 60 may be aligned with (e.g., disposed inside) the corresponding aperture 52 in direction 58. However, in certain embodiments, each heat sink 54 may be aligned with (e.g., disposed inside) the corresponding aperture 52 in direction 58. Further, in certain embodiments, both the thermal pad 60 and the heat sink 54 (or at least portions thereof) may be aligned with (e.g., disposed inside) the aperture 52. Further still, the thermal pad 60, the heat sink 54, both, or neither may be embedded in (e.g., overmolded with) the wall 46 of the housing 30 within the corresponding aperture 52. However, in other embodiments, the heat sink 54 and/or the thermal pad 60 may be otherwise coupled to the battery module 20. For example, the heat sink 54 may be fastened to the wall 46 of the housing 30 within the aperture 52, and the thermal pad 60 may be adhesively coupled to the heat sink 54 between the heat sink 54 and the base ends 44 of the electrochemical cells 32.

It should also be noted that, in some embodiments, the battery module 20 may be disposed proximate to components of the vehicle 10 of FIG. 1. For example, the battery module 20 may be positioned within the vehicle 10 such that components of the vehicle 10 are close to, or in contact with, the wall 46 of the housing 20. In general, the heat sinks 54 may extract heat away from the electrochemical cells 32 and convey the heat to an environment 68 outside of the battery module 20 more quickly if the cooling fins 56 of the heat sink 54 do not contact other components of the vehicle 10. Accordingly, the battery module may include feet 70 extending from an external surface 69 of the wall 46 in direction 58 (e.g., in the same direction 58 as the cooling fins 56) to block external components from contacting the cooling fins 56. Further, the feet 70 run (e.g., extend) along the wall 46 generally in direction 48. Indeed, in the illustrated embodiment, the feet 70 extend from the external surface 69 of the wall 46 in direction 58 a first distance 72 from the external surface 69 of the wall 46, the cooling fins 56 extend from the heat sink 54 in direction 58 a second distance 74 from the external surface 69 of the wall 46, and the first distance 72 is greater than the second distance 74. Thus, in some embodiments, the battery module 20 may be stood upright on a surface (e.g., a surface of the vehicle 10 of FIG. 1 external to the battery module 20) such that the feet 70 extending from the external surface 69 of the wall 46 contact the external surface. In other words, the battery module 20 may be stood up on the feet 70 without causing some or all of the cooling fins 56 to contact the surface of the vehicle 10. Thus, the cooling fins 56 may more evenly convey heat to the environment 68.

Figure 7:
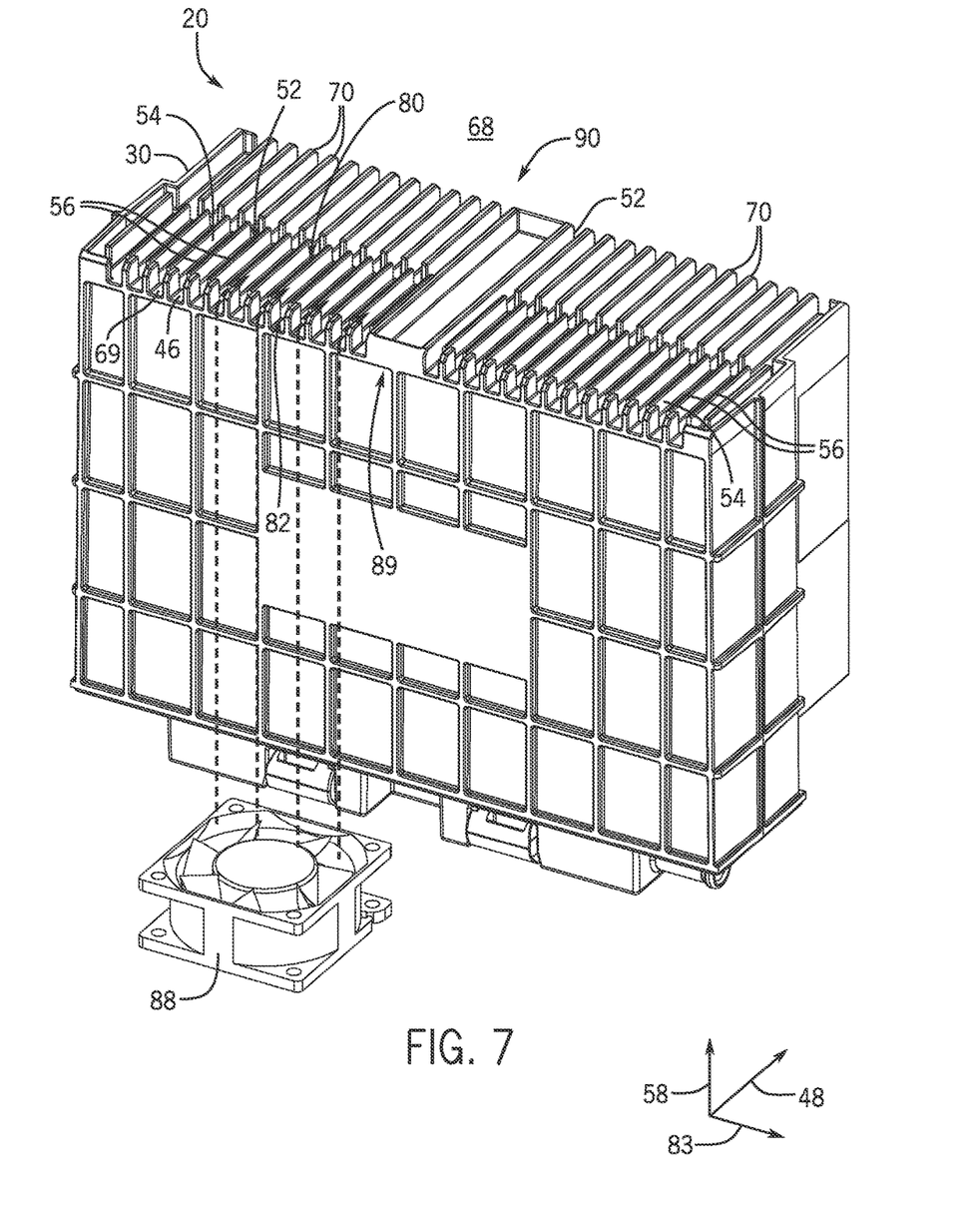
FIG. 7 is a perspective view of a portion of an embodiment the battery module of FIG. 3, in accordance with an aspect of the present disclosure.
Figure 8:
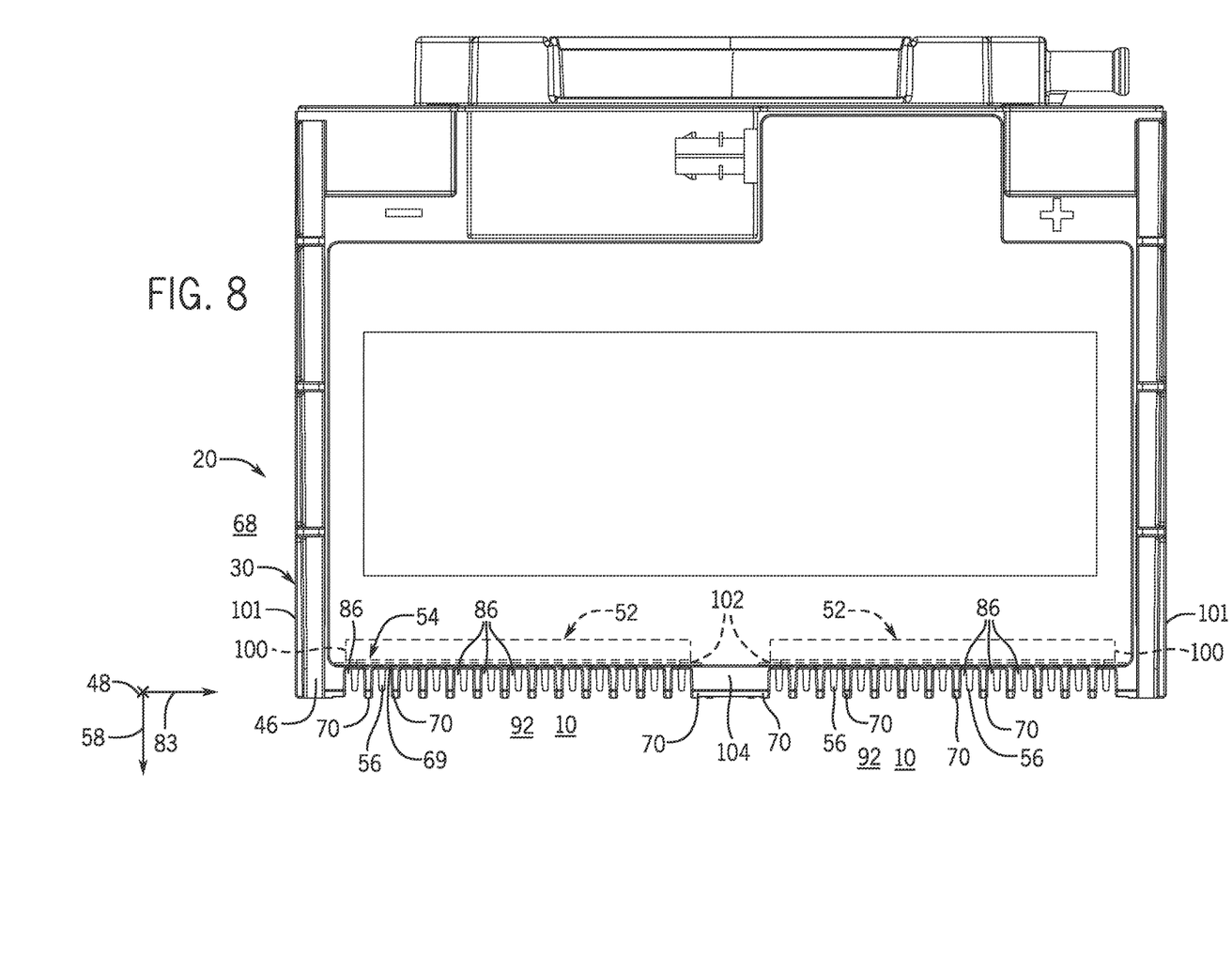
FIG. 8 is a schematic side view of a portion of an embodiment the battery module of FIG. 3, in accordance with an aspect of the present disclosure.

In addition to blocking the cooling fins 56 from contacting components external to the battery module 20, the feet 70 may also direct a cooling fluid (e.g., air) toward the cooling fins 56 to enhance heat extraction from the cooling fins 56. To help illustrate, perspective and schematic side views of embodiments of the battery module 20 of FIG. 3 are shown in FIGS. 7 and 8. Focusing first on FIG. 7, the housing 30 of the battery module 20 includes, as previously described, apertures 52 configured to receive, for example, the heat sinks 54 having the cooling fins 56 extending from the heat sinks 54. Indeed, in the illustrated embodiment, these two features are in an engaged configuration. Further, each aperture 52 and corresponding heat sink 54 is aligned with a middle region of the wall 46 of the housing 30 with respect to direction 48. Accordingly, the feet 70 of the housing 30 (e.g., extending away from the external surface 69 of the back wall 46 of the housing 30) surround each of the heat sinks 54 proximate to at least a first side 80 (e.g., top side) of each heat sink 54 and a second side 82 (e.g., bottom side) of each heat sink 54 opposite the first side 80. Further, each pair of adjacent feet 70 forms a cooling channel 86 between the feet 70 of the pair. The feet 70 of the housing 30 and the cooling fins 56 of the heat sinks 54 are offset (e.g., staggered) in direction 83 such that each cooling channel 86 is aligned with one of the cooling fins 56. Accordingly, fluid flow (e.g., air flow) may be routed through each cooling channel 86 directly into the cooling fin 56 aligned with the cooling channel 86, thereby increasing a heat transfer out of the cooling fin 56 to the environment. In some embodiments, an active cooling system 88 (e.g., a fan) may urge the fluid flow (e.g., air flow) toward the cooling channels 86. Other components may be included with the battery module 20 to route the fluid flow from the active cooling system 88 toward the feet 70 and the cooling fins 56 proximate to the wall 46 of the housing 30. Further, the active cooling system 88 may be disposed on a first side 89 of the housing 30 as shown, or on a second side 90 of the housing 30 opposite to the first side 89. However, in some embodiments, ambient air may travel through the cooling channels 86 without an active cooling system incorporated with the battery module 20. Further, by disposing the apertures 52 and corresponding heat sinks 54 in the middle region of the wall with respect to direction 48 as described above, the cooling channels 86 may be formed on the first side 80 and the second side 82 of each heat sink 54. Thus, fluid flow (e.g., air flow) may be routed through the cooling channels 86 in either direction (e.g., in direction 48 or opposite to direction 48) toward the cooling fins 56 extending from the heat sinks 54 in the middle region of the wall 46.

Focusing now on FIG. 8, the battery module 20 is positioned on a surface 92 of the vehicle 10. More specifically, the battery module 20 in the illustrated embodiment is positioned such that the feet 70 of the housing 30 contact the surface 92 of the vehicle 10. As shown, and as previously described, the feet 70 and the cooling fins 56 of the heat sinks 54 are offset (e.g., staggered) with respect to direction 83. Accordingly, the cooling channels 86 defined by pairs of adjacent feet 70 (and, in the illustrated embodiment, between the external surface 69 of the wall 46 of the housing 30 and the surface 92 of the vehicle 10) are aligned in direction 83 with a corresponding one of the cooling fins 56. The alignment between the cooling fins 56 and the cooling channels 86 enables a fluid flow (e.g., air flow) through the cooling channels 86 directly into the corresponding cooling fins 56.

Further, in accordance with the present disclosure, the heat sinks 54 in the illustrated embodiment are disposed in the apertures 52, where the apertures 52 are offset from outer edges 101 of the housing 30 with respect to direction 83 such that feet 70 may be disposed proximate to a third side 100 of each aperture 54 (and corresponding heat sink 54) and proximate to a fourth side 102 of each aperture 54 (and corresponding heat sink 54) opposite to the third side 100. An intervening section 104 of the housing 30 may be disposed between the fourth sides 102 of the heat sinks 54. The intervening section 104 of the housing 30 may include no metal portions (e.g., no portions of the heat sinks 54), thereby reducing a material cost of the heat sinks 54. Further, the intervening section 104 may be aligned with an area between the two stacks 50 of electrochemical cells 32 (e.g., as shown in FIG. 4). Thus, heat extraction from each stack 50 to each corresponding heat sink 54 is more even, and a thermal gradient between the two stacks 50 and corresponding heat sinks 54 (e.g., proximate to the intervening section 104 of the housing 30) is reduced.

Figure 9:
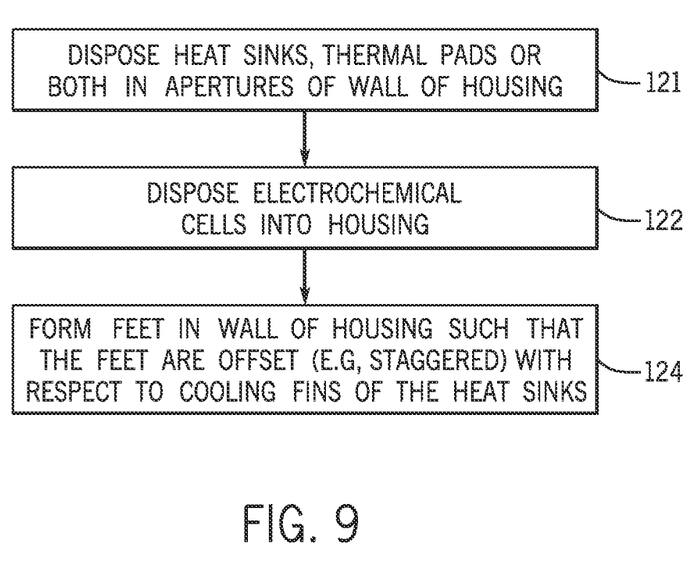
FIG. 9 is a process flow diagram illustrating an embodiment of a method of manufacturing a battery module, in accordance with an aspect of the present disclosure.

Turning now to FIG. 9, a process flow diagram of an embodiment of a method 120 of manufacturing the battery module 20, in accordance with the present disclosure, is shown. In the illustrated embodiment, the method 120 includes disposing the heat sinks 54, the thermal pads 60, or both into the apertures 52 in the wall 46 (e.g., back wall) of the housing 30 (block 121). For example, the heat sinks 54 may be over-molded with the wall 46 of the housing 30 within the apertures 52. The thermal pads 60 may be adhesively coupled to the heat sinks 54 on an inside of the housing 30.

Further, the method 120 includes disposing the electrochemical cells 32 into the housing 30 of the battery module 20 (block 122). For example, the electrochemical cells 32 may be positioned in two stacks 50 within the housing 30, each stack 50 having, for example, three electrochemical cells 32 stacked together broad face 45 against broad face 45. The two stacks 50 may correspond (and be aligned) with the apertures 52 in the wall 46 of the housing 30 and the corresponding heat sinks 54 and thermal pads 60. Specifically, the base ends 44 of the electrochemical cells 32 may contact the thermal pads 60, or be otherwise positioned proximate to the thermal pads 60 and/or the heat sinks 54.

Further still, the method 120 includes forming the feet 70 in the wall 46 of the housing 30 such that the feet 70 are offset (e.g., staggered) with respect to the cooling fins 56 of the heat sinks 54 (block 124). In other words, the feet 70 extend from the wall 46 in the same direction as the cooling fins 56 extend from the heat sinks 54. However, the feet 70 are offset or staggered with respect to the cooling fins 56 such that each pair of adjacent feet 70 forms one of the channels 86 (e.g., cooling channels) that aligns with a corresponding one of the cooling fins 54. It should be noted that the feet 70 may be formed extending from the wall 46 as the heat sinks 54 are over-molded with the housing 30.

One or more of the disclosed embodiments, alone or in combination, may provide one or more technical effects useful in the manufacture of battery modules, and portions of battery modules. In general, embodiments of the present disclosure include a battery module with a housing configured to retain electrochemical cells such that base ends of the electrochemical cells contact, or are positioned proximate to, heat sinks disposed in apertures in a back wall of the housing. The heat sinks may include cooling fins extending outwardly from the heat sinks (e.g., away from the electrochemical cells). The back wall may include feet extending in a direction generally parallel with the cooling fins. However, the feet may be staggered or offset with respect to the cooling fins such that cooling channels defined between pairs of adjacent feet are aligned with the cooling fins, thereby enhancing heat transfer from the cooling fins to fluid flow (e.g., air flow or ambient air) that passes through the cooling channels directly into the cooling fins. Further, the feet extend farther from the back wall of the housing than the cooling fins, such that the feet protect the cooling fins from being contacted by objects or components (e.g., of a vehicle) external to the battery module. The technical effects and technical problems in the specification are exemplary and are not limiting. It should be noted that the embodiments described in the specification may have other technical effects and can solve other technical problems.

While only certain features and embodiments have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, colors, orientations, etc.) without materially departing from the novel teachings and advantages of the disclosed subject matter. The order or sequence of any process or method steps may be varied or re-sequenced according to alternative embodiments. Furthermore, in an effort to provide a concise description of the exemplary embodiments, all features of an actual implementation may not have been described. It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The invention claimed is:

1. A battery module, comprising:
a housing having a wall with an aperture;
an electrochemical cell having a terminal end and a base end opposite the terminal end, wherein the electrochemical cell is disposed within the housing such that the base end is positioned proximate to the aperture of the wall;
a heat sink disposed in the aperture and having cooling fins extending outwardly from the heat sink in a first direction and along the heat sink in a second direction transverse to the first direction; and
feet of the housing extending outwardly from an external surface of the wall in the first direction and along the wall in the second direction, wherein the feet and the cooling fins are offset with respect to each other along the second direction, wherein each pair of adjacent feet defines a channel between the adjacent feet of the pair, and wherein the feet and the cooling fins are staggered with respect to each other in a third direction transverse to the first and second directions such that each cooling fin is aligned with a corresponding one of the channels defined by one of the pair of adjacent feet.

2. The battery module of claim 1, wherein the aperture is disposed in a middle region of the wall such that the wall surrounds the aperture.

3. The battery module of claim 2, wherein the feet surround the cooling fins on at least a first edge and a second edge of the heat sink.

4. The battery module of claim 3, wherein each channel proximate to the first edge of the heat sink is aligned with a respective channel proximate to the second edge of the heat sink.

5. The battery module of claim 1, comprising a thermal pad disposed between the heat sink and the base end of the electrochemical cell.

6. The battery module of claim 1, wherein the housing and the feet are non-metallic, and wherein the heat sink and the cooling fins of the heat sink are metal.

7. The battery module of claim 1, comprising a second electrochemical cell and a third electrochemical cell, wherein the second and third electrochemical cells comprise terminal ends and base ends opposite to the terminal ends, wherein the electrochemical cell and the second and third electrochemical cells are disposed in a stack in the housing of the battery module, and wherein the base ends of the second and third electrochemical cells are positioned proximate to the aperture of the wall.

8. The battery module of claim 1, comprising a cover configured to exert a force against the terminal end of the electrochemical cell such that the base end of the electrochemical cell is pressed toward the heat sink.

9. The battery module of claim 1, wherein the electrochemical cell is a prismatic electrochemical cell, a lithium-ion (Li-ion) electrochemical cell, or a combination thereof.

10. The battery module of claim 1, wherein the feet are configured to contact a surface external to the battery module to further define the channels between the pairs of adjacent feet.

11. A battery module, comprising:
a housing having a back wall, an aperture in the back wall, and feet extending outwardly from the back wall a first distance from the back wall; and
a heat sink disposed in the aperture, wherein the heat sink comprises cooling fins extending outwardly from the heat sink a second distance from the back wall, wherein the first distance is greater than the second distance, and wherein the cooling fins run along the heat sink a first direction generally parallel with a second direction the feet run along the back wall of the housing.

12. The battery module of claim 11, comprising a plurality of electrochemical cells having terminals extending from terminal ends of the plurality of electrochemical cells and base ends opposite the terminal ends, wherein the plurality of electrochemical cells are disposed in the housing such that the base ends of the plurality of electrochemical cells are positioned adjacent the heat sink.

13. The battery module of claim 12, comprising a thermal pad disposed between the base ends of the plurality of electrochemical cells and the heat sink.

14. The battery module of claim 11, wherein the feet comprise pairs of adjacent feet, wherein each pair of adjacent feet defines a channel between the adjacent feet of the pair, and wherein each channel is aligned with a corresponding cooling fin of the cooling fins.

15. The battery module of claim 14, wherein the feet are disposed proximate to a first edge of the aperture and proximate to a second edge of the aperture opposite to the first edge, and wherein each pair of adjacent feet on the first edge of the aperture is aligned with a corresponding pair of adjacent feet on the second edge of the aperture.

16. The battery module of claim 15, wherein at least one foot of the feet is disposed proximate to a third edge of the aperture, wherein at least one foot of the feet is disposed proximate to a fourth edge of the aperture, and wherein the at least one foot proximate to the third edge and the at least one foot proximate to the fourth edge extend along substantially an entire length of the back wall.

17. The battery module of claim 11, comprising an active cooling system configured to provide a fluid flow to the back wall of the housing.

18. A battery module, comprising:
a housing having a cavity;
a plurality of electrochemical cells disposed in the cavity of the housing;
at least one heat sink disposed in a corresponding at least one aperture of a back wall of the housing such that base ends of the plurality of electrochemical cells are disposed proximate to the at least one heat sink, wherein the at least one heat sink comprises cooling fins extending outwardly and away from the cavity of the housing a first distance from the housing, wherein the housing comprises feet extending outwardly from the housing a second distance from the housing greater than the first distance, and wherein the feet define channels that are aligned with the cooling fins of the heat sink.

19. The battery module of claim 18, comprising at least one thermal pad disposed between the at least one heat sink and the base ends of the plurality of electrochemical cells of the battery module.

20. A battery module, comprising:
a housing having a wall with an aperture;
an electrochemical cell having a terminal end and a base end opposite the terminal end, wherein the electrochemical cell is disposed within the housing such that the base end is positioned proximate to the aperture of the wall;
a heat sink disposed in the aperture and having cooling fins extending outwardly from the heat sink in a first direction; and
feet of the housing extending outwardly from an external surface of the wall in the first direction, wherein each pair of adjacent feet defines a channel between the adjacent feet of the pair, and wherein the feet and the cooling fins are staggered with respect to each other such that each cooling fin is aligned with a corresponding one of the channels defined by one of the pair of adjacent feet;
wherein the cooling fins extend outwardly from the heat sink a first distance from the external surface of the wall, wherein the feet of the housing extend outwardly from the external surface of the wall a second distance from the external surface of the wall, and wherein the second distance is greater than the first distance.

21. A battery module, comprising:
a housing having a wall with an aperture;
an electrochemical cell having a terminal end and a base end opposite the terminal end, wherein the electrochemical cell is disposed within the housing such that the base end is positioned proximate to the aperture of the wall;
a heat sink disposed in the aperture, over-molded with the wall of the housing within the aperture, and having cooling fins extending outwardly from the heat sink in a first direction; and
feet of the housing extending outwardly from an external surface of the wall in the first direction, wherein each pair of adjacent feet defines a channel between the adjacent feet of the pair, and wherein the feet and the cooling fins are staggered with respect to each other such that each cooling fin is aligned with a corresponding one of the channels defined by one of the pair of adjacent feet.

22. A battery module, comprising:
a housing having a wall with an aperture;
an electrochemical cell having a terminal end and a base end opposite the terminal end, wherein the electrochemical cell is disposed within the housing such that the base end is positioned proximate to the aperture of the wall;
a heat sink disposed in the aperture and having cooling fins extending outwardly from the heat sink in a first direction; and
feet of the housing extending outwardly from an external surface of the wall in the first direction, wherein each pair of adjacent feet defines a channel between the adjacent feet of the pair, wherein the feet and the cooling fins are staggered with respect to each other such that each cooling fin is aligned with a corresponding one of the channels defined by one of the pair of adjacent feet, wherein the housing and the feet of the housing are plastic, and wherein the heat sink and the cooling fins of the heat sink are metal.

* * * * *

UNITED STATES PATENT AND TRADEMARK OFFICE
CERTIFICATE OF CORRECTION

| | | |
|---|---|---|
| PATENT NO. | : 9,620,764 B2 | Page 1 of 2 |
| APPLICATION NO. | : 14/634236 | |
| DATED | : April 11, 2017 | |
| INVENTOR(S) | : Richard M. DeKeuster | |

It is certified that error appears in the above-identified patent and that said Letters Patent is hereby corrected as shown below:

On the Title Page

In Item (71), under "Applicant", in Column 1, Line 2, please delete "WI (US)" and insert -- MI (US) --.

In the Drawings

In FIG. 9, Sheet 8 of 8, please insert Main Designator -- 120 --.

In the Specification

In Column 2, Line 63, please delete "a first" and insert -- in a first --.

In Column 3, Lines 38-39, please delete "embodiment the" and insert -- embodiment of the --.

In Column 3, Line 42, please delete "embodiment the" and insert -- embodiment of the --.

In Column 8, Line 4, please delete "Further" and insert -- Further, --.

In Column 8, Line 29, please delete "housing 20," and insert -- housing 30, --.

In Column 9, Line 6, please delete "housing 20." and insert -- housing 30. --.

In Column 10, Line 37, please delete "aperture 54" and insert -- aperture 52 --.

In Column 10, Line 38, please delete "aperture 54" and insert -- aperture 52 --.

In Column 11, Line 18, please delete "cooling fins 54" and insert -- cooling fins 56 --.

Signed and Sealed this
Twenty-third Day of January, 2018

Joseph Matal
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 9,620,764 B2

In the Claims

In Column 13, Line 3, in Claim 11, please delete "a first" and insert -- in a first --.